(12) United States Patent
Heejoon et al.

(10) Patent No.: US 8,252,191 B2
(45) Date of Patent: Aug. 28, 2012

(54) SUB-MICRON DECAL TRANSFER LITHOGRAPHY

(75) Inventors: Ahn Heejoon, Seoul (KR); Ralph Nuzzo, Champaign, IL (US); Anne Shim, Plaistow, NH (US)

(73) Assignee: Dow Corning Corporation, Midland, MI (US)

( * ) Notice: Subject to any disclaimer, the term of this patent is extended or adjusted under 35 U.S.C. 154(b) by 1081 days.

(21) Appl. No.: 11/911,787

(22) PCT Filed: May 5, 2006

(86) PCT No.: PCT/US2006/017498
§ 371 (c)(1),
(2), (4) Date: Oct. 17, 2007

(87) PCT Pub. No.: WO2006/121906
PCT Pub. Date: Nov. 16, 2006

(65) Prior Publication Data
US 2008/0190888 A1    Aug. 14, 2008

Related U.S. Application Data

(60) Provisional application No. 60/679,558, filed on May 10, 2005.

(51) Int. Cl.
*B44C 1/22* (2006.01)
(52) U.S. Cl. ............. 216/43; 216/49; 216/52; 216/54
(58) Field of Classification Search ............ 216/43, 216/49, 52, 54
See application file for complete search history.

(56) References Cited

U.S. PATENT DOCUMENTS

| | | | |
|---|---|---|---|
| 6,204,079 B1 | 3/2001 | Aspar et al. | |
| 6,482,742 B1 | 11/2002 | Chou | |
| 6,645,432 B1 | 11/2003 | Anderson et al. | |
| 6,805,809 B2 | 10/2004 | Nuzzo et al. | 216/54 |
| 7,662,545 B2 | 2/2010 | Nuzzo et al. | |
| 7,704,432 B2 | 4/2010 | Dumond et al. | |
| 8,025,831 B2 | 9/2011 | Kong et al. | |
| 2003/0134460 A1* | 7/2003 | Forbes et al. | 438/158 |
| 2003/0141276 A1 | 7/2003 | Lee | |
| 2003/0222048 A1* | 12/2003 | Asakawa et al. | 216/2 |
| 2004/0040653 A1* | 3/2004 | Nuzzo et al. | 156/273.3 |
| 2004/0104272 A1 | 6/2004 | Figuet et al. | |
| 2005/0238967 A1* | 10/2005 | Rogers et al. | 430/5 |
| 2005/0258571 A1* | 11/2005 | Dumond et al. | 264/293 |
| 2007/0166479 A1 | 7/2007 | Drake et al. | |
| 2008/0020547 A1 | 1/2008 | Kostrzewa et al. | |
| 2010/0294844 A1* | 11/2010 | Loiret-Bernal et al. | 235/494 |

FOREIGN PATENT DOCUMENTS

| | | |
|---|---|---|
| JP | 2004-353584 | 12/2004 |
| WO | WO 2004/021084 | 3/2004 |

* cited by examiner

*Primary Examiner* — Binh X Tran
(74) *Attorney, Agent, or Firm* — Brinks Hofer Gilson & Lione

(57) ABSTRACT

The present invention provides a method of sub-micron decal transfer lithography. The method includes forming a first pattern in a surface of a first silicon-containing elastomer, bonding at least a portion of the first pattern to a substrate, and etching a portion of at least one of the first silicon-containing elastomer and the substrate.

41 Claims, 14 Drawing Sheets

SUB-MICRON DECAL TRANSFER LITHOGRAPHY

STATEMENT REGARDING FEDERALLY SPONSORED RESEARCH OR DEVELOPMENT

This application was partially supported by the Department of Energy (DEFG02-91-ER-45439).

BACKGROUND OF THE INVENTION

1. Field of the Invention

This invention relates generally to lithography, and, more particularly, to soft lithography.

2. Description of the Related Art

Soft lithography is a patterning technique used in microfabrication to produce microstructures by transferring a pattern from a master to a substrate using a patterned elastomer. For example, patterns may be transferred by printing, molding, or embossing with a polydimethylsiloxane (PDMS) elastomeric stamp. The elastomeric stamp can be prepared by casting prepolymers against masters patterned by conventional photolithographic techniques. Representative soft lithographic techniques include contact printing, replica molding, transfer molding, micro-molding, micro-molding in capillaries, solvent assisted micro-molding, and the like. These soft lithographic techniques may be useful for fabricating a variety of functional components and devices that may be used in areas including optics, microelectronics, microanalysis, micro-electro-mechanical systems, and the like.

Decal transfer lithography is a type of soft lithography based on the transfer of polydimethylsiloxane patterns to a substrate via the engineered adhesion and release properties of a compliant polydimethylsiloxane stamp. FIGS. 1A, 1B, 1C, and 1D conceptually illustrate a conventional decal transfer lithography technique. FIG. 1A shows a silicon-containing elastomer 10 that has been patterned using a master pattern 20. The silicon-containing elastomer 10 is then removed from the master pattern 20, as shown in FIG. 1B, and placed in contact with a substrate 30 such that the portions of the silicon-containing elastomer 10 that are in contact with the substrate 30 become irreversibly attached to the substrate 30. A bulk portion 40 of the silicon-containing elastomer 10 is pulled away from the substrate 30. The silicon-containing elastomer 10 undergoes cohesive failure, leaving behind a patterned portion 50 of the silicon-containing elastomer 10.

Conventional decal transfer techniques, such as the technique shown in FIGS. 1A-D, are useful for delivering micron-size polydimethylsiloxane patterns to flat or curved large-area electronic materials such as silicon, silicon dioxide, and other metals in films. However, conventional decal transfer techniques may not be able to effectively transfer submicron-size patterns due to limitations arising from the mechanical properties of the polymers used to form the elastomeric stamps. For example, the locus of cohesive failure of the silicon-containing elastomer 10 shown in FIGS. 1A-D progressively approaches a surface of the patterned features 50 as the size of the patterned features 50 approach the 1 micron level.

The present invention is directed to addressing the effects of one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided for sub-micron decal transfer lithography. The method includes forming a first pattern in a surface of a first silicon-containing elastomer, bonding at least a portion of the first pattern to a substrate, and etching a portion of at least one of the first silicon-containing elastomer and the substrate.

In another embodiment of the present invention, a method is provided for sub-micron decal transfer lithography. The method includes forming a pattern in a surface of a silicon-containing elastomer, bonding the pattern to a substrate such that the pattern and the substrate are irreversibly attached, and etching a portion of the silicon-containing elastomer.

In yet another embodiment of the present invention, a method is provided for sub-micron decal transfer lithography. The method includes forming a first pattern in a surface of a first silicon-containing elastomer, bonding at least a portion of the first pattern to a substrate, and etching a portion of the substrate.

BRIEF DESCRIPTION OF THE DRAWINGS

The invention may be understood by reference to the following description taken in conjunction with the accompanying drawings, in which like reference numerals identify like elements, and in which.

Figure 1A:
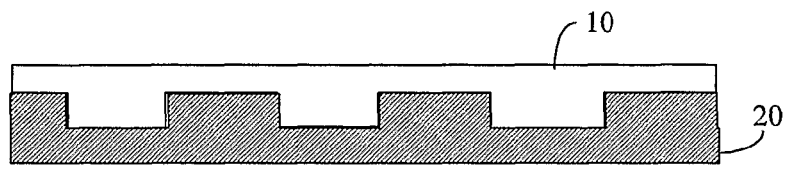
FIGS. 1A, 1B, 1C, and 1D conceptually illustrate a conventional decal transfer lithography technique.
Figure 1B:
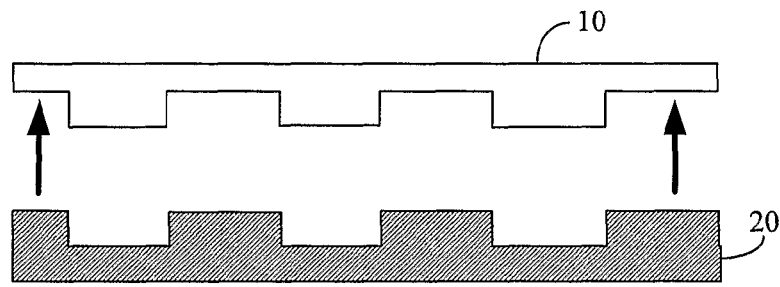
Figure 1C:
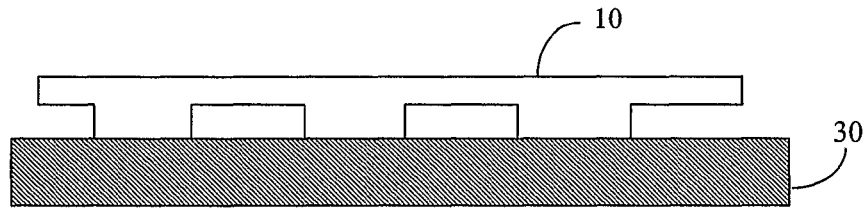
Figure 1D:
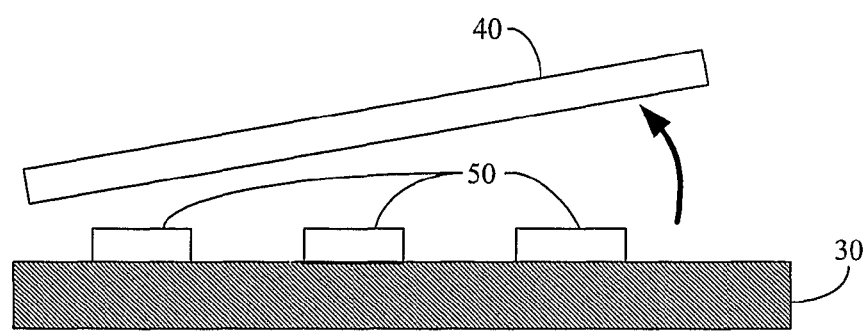

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
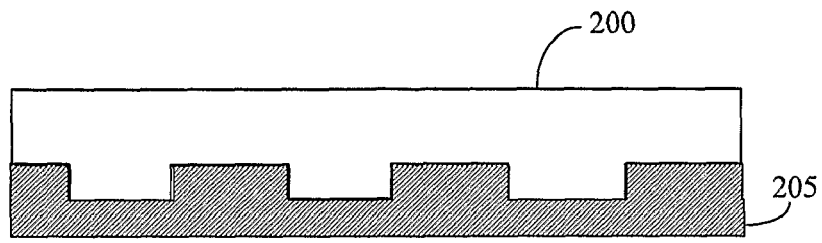
FIGS. 2A, 2B, 2C, 2D, and 2E conceptually illustrate a decal transfer lithography technique including etching, in accordance with the present invention.

FIGS. 2A, 2B, 2C, 2D and 2E conceptually illustrate a decal transfer lithography technique including etching. In the illustrated embodiment, FIG. 2A shows a silicon-containing elastomer 200 that has been patterned using a master pattern 205. As used herein, the term "elastomer" is defined as a polymer which can return to its initial dimensions when deformed by an external force. A polymer is considered an elastomer when the polymer meets the following standard. A sample of the polymer in its solid state and having an initial linear dimension of $D^o$ is subjected to a force such that the dimension is changed by about 10%. If the dimension of an elastomer assumes a value $D^e$, where $D^e \cong D^o \pm 0.01$ $D^o$ once the force is no longer applied, the polymer is considered an elastomer. As used herein, the term "silicon-containing elastomer," is an elastomer which contains silicon atoms. Examples of silicon-containing elastomers include, but are not limited to, polysiloxane, block copolymers containing segments of a polysiloxane and a polymer, and silicon-modified elastomers. Additional examples of silicon-containing elastomers may be found in U.S. Pat. No. 6,805,809, which is incorporated herein by reference in its entirety. In the illustrated embodiment, the silicon-containing elastomer 200 is polydimethylsiloxane (PDMS).

Figure 2B:
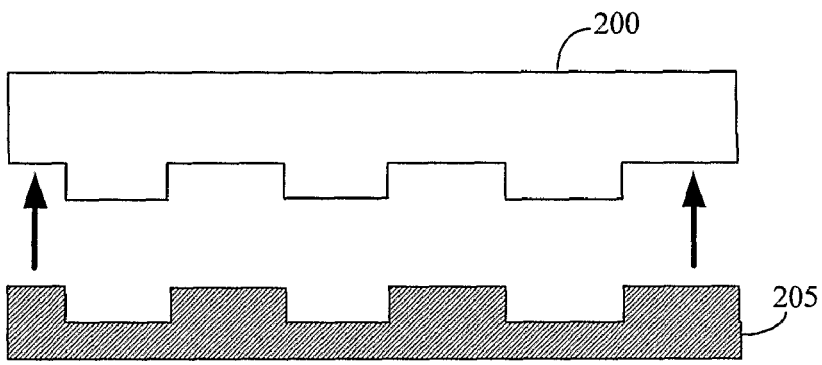
Figure 2C:
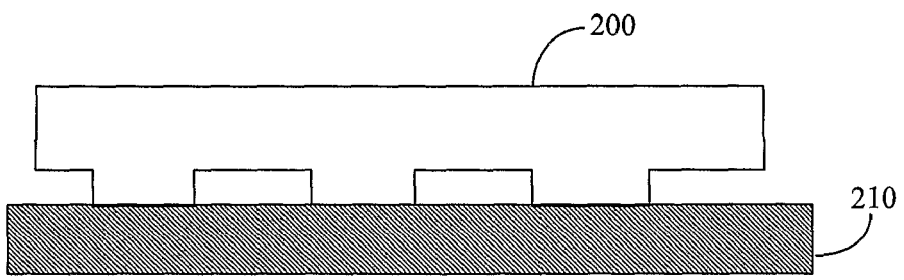

In one embodiment, the silicon-containing elastomer 200 is formed by spin-casting a polydimethylsiloxane prepolymer onto the master 205, curing, and then removing the silicon-containing elastomer 200, as will be discussed in detail below. However, persons of ordinary skill in the art should appreciate that the present invention is not limited to this particular technique for forming a silicon-containing elastomer 200. In alternative embodiments, any desirable technique for forming the silicon-containing elastomer 200 may be used. For example, the patterned silicon-containing elastomer 200 may be formed by polymerizing monomers and/or prepolymers, by cross-linking monomers, prepolymers, and/or polymers, or by solidifying the silicon-containing elastomer 200 from a liquid or molten state. Additional examples of techniques for forming the silicon-containing elastomer 200 may be found in U.S. Pat. No. 6,805,809. The silicon-containing elastomer 200 is then removed from the master 205, as shown in FIG. 2B.

The silicon-containing elastomer 200 is irreversibly attached to a substrate 210. As used herein, the term "irreversibly attached," means that the bonding between two substances is sufficiently strong that the substances cannot be mechanically separated without damaging and/or destroying one or both of the substances. However, persons of ordinary skill in the art should appreciate that the term "irreversibly attached," does not mean that it is impossible to separate the two bonded substances. For example, substances that are irreversibly attached may be separated by exposure to an appropriate chemical environment, which may include chemical reagents and/or irradiation. In one embodiment, the silicon-containing elastomer 200 may be irreversibly attached to the substrate 210 by bringing the patterned portion of the silicon-containing elastomer 200 into contact with the substrate 210 for a selected time period and curing at a selected temperature for a selected curing time, as will be discussed in detail below. Exemplary substrates 210 include, but are not limited to, silicon, ceramic materials, polymers, elastomers, metals, and the like.

Figure 2D:
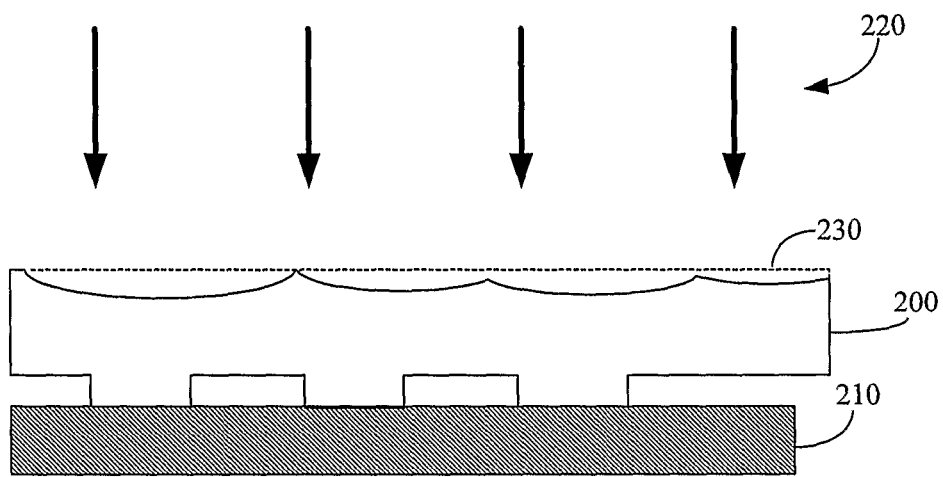

The silicon-containing elastomer 200 is etched using an etching process, as indicated by the arrows 220 shown in FIG. 2D, which depicts the silicon-containing elastomer 200 at an intermediate stage of the etching process. In one embodiment, the etching process is a reactive ion etching process (RIE) 220. For example, the silicon-containing elastomer 200 may be etched chemically by reactive species, physically by ion bombardment, or by a combination of chemical and physical mechanisms, as will be discussed in detail below. However, persons of ordinary skill in the art should appreciate that any desirable etching process 220 may be used to etch the silicon-containing elastomer 200. Etching of the silicon-containing elastomer 200 removes a portion 230 of the silicon-containing elastomer 200.

Figure 2E:
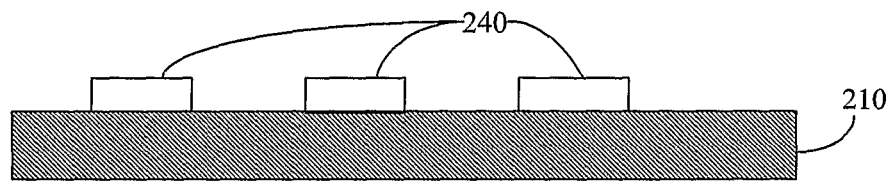

FIG. 2E shows the silicon-containing elastomer 200 substantially after the etching process 220 is complete. In the illustrated embodiment, patterned portions 240 of the silicon-containing elastomer 200 remain irreversibly attached to the substrate 210 after completion of the etching process. The patterned portion 240 and/or the substrate 210 may then be cleaned, as will be discussed in detail of. In one embodiment, the patterned portion 240 may be used as a mask for subsequent isotropic and/or anisotropic etching processes. By using the etching process to remove portions of the silicon-containing elastomer 200, characteristic length scales of the patterned portions 240, such as critical dimension of the patterned portions 240, may be reduced to the sub-micron scale. Accordingly, the techniques described herein may be particularly useful for fabricating submicron, high aspect ratio resist features 240 on the substrate 210.

FIGS. 3A, 3B, 3C, and 3D conceptually illustrate one exemplary embodiment of a procedure for fabricating submicron, high aspect ratio resist features on a substrate 300. In the illustrated embodiment, a PDMS prepolymer was spin-cast onto a master 305 with submicron features 310 (i.e., a photoresist patterned silicon wafer) and cured at 70° C. for 20 minutes to form the silicon-containing elastomer 315, also referred to as a PDMS decal 315 or a closed PDMS decal 315. Although not necessary to the practice of the present invention, the master 305 may, in some embodiments, be coated with a release layer 320. After curing, the PDMS coated master 305, 315, 320 may be exposed to UV/Ozone (UVO) and tridecafluoro-1,1,2,2-tetrahydrooctyl trichlorosilane ("No Stick") to form a release layer 325. In the illustrated embodiment, the PDMS coated master 305, 315, 320 was exposed to UVO for 3 min, and then immediately treated with tridecafluoro-1,1,2,2-tetrahydrooctyl trichlorosilane ("No Stick") for 20 min by placing the sample in a dry container with an open vial of "No Stick". A low pressure mercury lamp (BHK), (173 µW/cm$^2$) was used for UV/Ozone (UVO) treatment of the PDMS coated master 305, 315, 320.

Figure 3A:
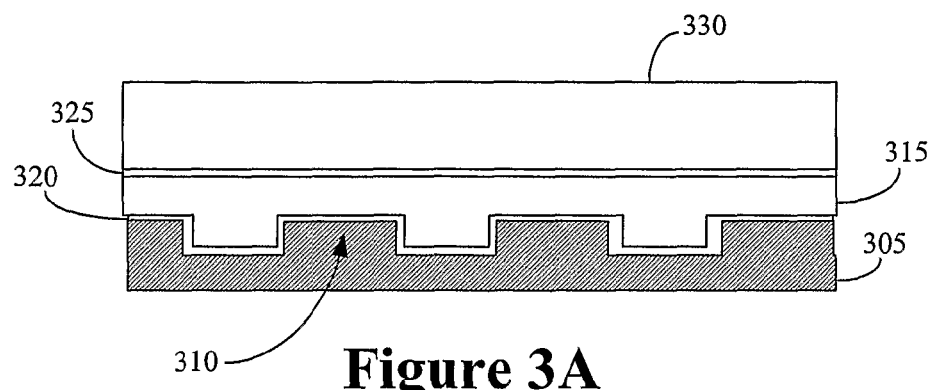
FIGS. 3A, 3B, 3C, and 3D conceptually illustrate one exemplary embodiment of a procedure for fabricating sub-micron, high aspect ratio resist features on a substrate, in accordance with the present invention.
Figure 3B:
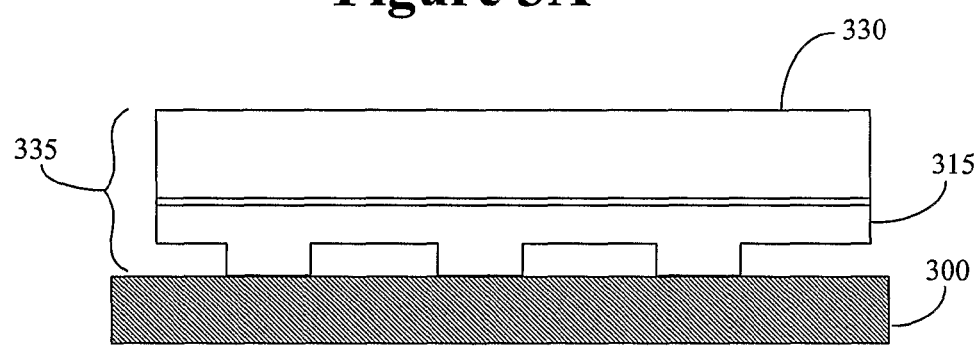

The PDMS coated master 305, 315, 320 was covered with a PDMS prepolymer layer 330, which was then cured in an oven at 70° C. to form the PDMS stamp 335 shown in FIG. 3B. In the illustrated embodiment, the PDMS stamp 335 was extracted from the master 305, and the patterned PDMS film was exposed to UVO for 150 sec and placed in contact with the target substrate 300. In various alternative embodiments, the target substrate 300 may be a glass slide, silicon, $SiO_2$, or any other desirable material. The PDMS stamp 335 and the substrate 300 were cured at 70° C. For example, the patterned PDMS film may be exposed to UVO for 150 sec and placed in contact with the target substrate 300 and cured at 70° C. for 30 min. The closed PDMS decal 315 was transferred onto the substrate 300 by peeling away the supporting PDMS layer 330.

Figure 3C:
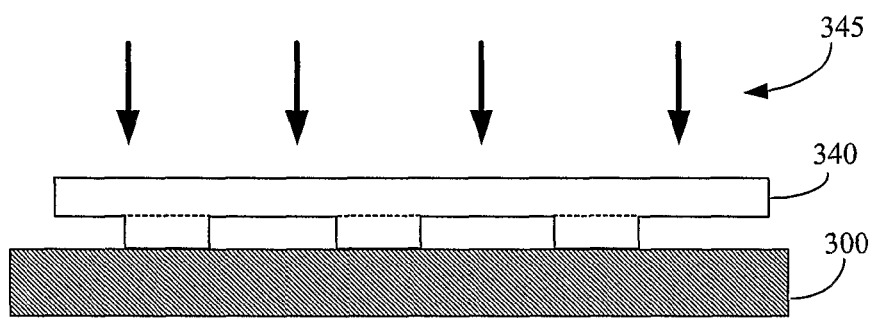
Figure 3D:
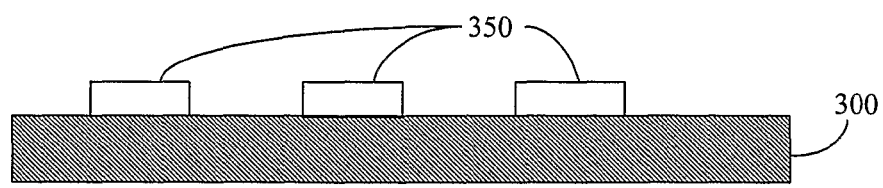

A top layer 340 of the PDMS decal 315 was then removed by reactive ion etching (RIE), as indicated by the arrows 345 in FIG. 3C. In the RIE process, portions of the PDMS decal 315 are etched chemically by reactive species or physically by ion bombardment or by a combination of chemical and physical mechanisms. Oxygen plasma is commonly used to etch hydrocarbon containing polymers. However, in the case of oxygen plasma etching of PDMS, a thin $SiO_2$ layer may be formed during etching with an oxygen plasma. Thus, a fluorine-based plasma may be used to etch the PDMS decal 315 by breaking the siloxane bond. In the illustrated embodiment, an $O_2/CF_4$ gas mixture was used to etch the PDMS decal 315. Dry etching in the illustrated embodiment was performed with a Uniaxis 790 Reactive Ion Etching system. For example, the PDMS decal 315 may be transferred onto a glass substrate 300 and RIE may be performed in a condition with 300 mTorr of total gas pressure, 5 sccm $O_2$ and/or 35 sccm $CF_4$ of gas flow rates, and 200 W of RF power. Discrete resist structures 350 may be formed by the etching process, as shown in FIG. 3D.

Figure 4:
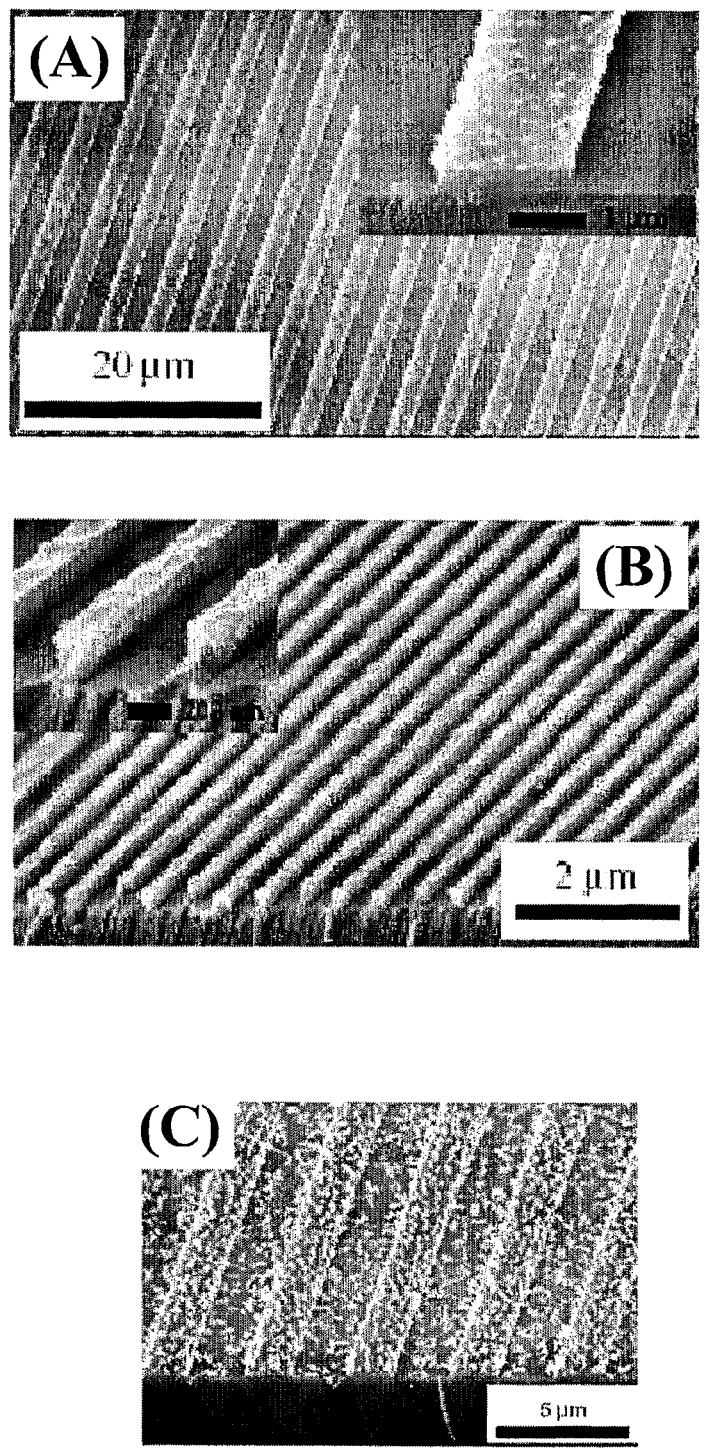
FIGS. 4A and 4B show scanning electron microscope (SEM) images of 2 μm and 300 nm line-patterned polydimethylsiloxane (PDMS), respectively, after removing the top layer of a closed-type PDMS decal by reactive ion etching (RIE), in accordance with the present invention.
FIG. 4C shows an SEM image of 2 μm wide PDMS lines patterned on a glass substrate after removing a top layer of a closed PDMS decal by $O_2/CF_4$ RIE, in accordance with the present invention.

FIGS. 4A and 4B show SEM images of 2 µm and 300 nm line-patterned PDMS after removing the top layer of a closed-type PDMS decal by RIE, as discussed above. FIG. 4C shows a scanning electron microscope (SEM) image of 2 µm wide PDMS lines patterned on a glass substrate after removing a top layer of a closed PDMS decal by $O_2/CF_4$ RIE. Scanning electron microscopy (SEM) may be performed with a Philips XL30 ESEM-FEG or a Hitachi S-4700 SEM. During etching, grass-like structures are formed on the top of the PDMS exposed to the RIE, as shown in FIG. 4C. Similar grass-like structures have been observed for the anisotropic etching of Si, GaAs, and polymers. Although the mechanism for the formation of grass-like structure is not completely understood, it has been proposed that defects or contaminations on the surface cause an evenness in the initial etching that forms the tips of the grass. The etching rate of the tip may be slower than the flat area in an anisotropic etching condition, thus the grass grows vertically as etching proceeds. In the case of PDMS etching, the grass-like structures were formed not only in an anisotropic condition, but also in an isotropic condition. Anisotropic etching of PDMS was observed to cause higher grass-like structure formation than the isotropic etching procedure. The fibril-like structures can be easily removed by rinsing the RIE exposed decal with acetone, isopropyl alcohol, and deionized water and then blow-drying with pure nitrogen gas.

Figure 5A:
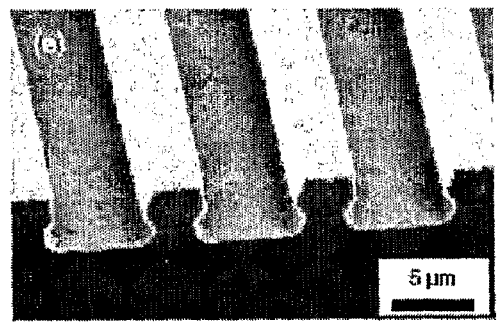
FIG. 5A shows an SEM image of 5 μm wide PDMS lines patterned on Si(100) after removing a top layer of a closed PDMS decal by $O_2/CF_4$ RIE, in accordance with the present invention.
Figure 5B:
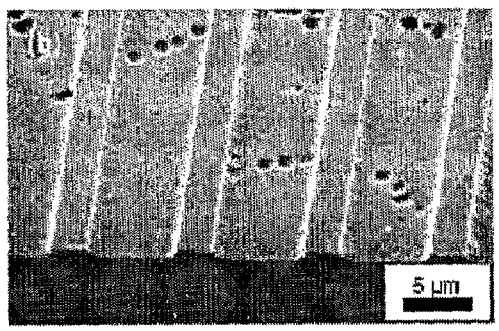
FIG. 5B shows an SEM image of the silicon surface shown in FIG. 5A after removing the PDMS by tetrabutylammonium fluoride, in accordance with the present invention.

FIG. 5A shows an SEM image of 5 µm wide PDMS lines patterned on Si(100) after removing a top layer of a closed PDMS decal by $O_2/CF_4$ RIE. The sample was rinsed with isopropyl alcohol, acetone, and deionized water, and then dried under a pure nitrogen gas stream. FIG. 5B shows an SEM image of the same silicon surface after removing the PDMS by tetrabutylammonium fluoride. To evaluate the possibility of using PDMS decal as a resist material on silicon substrate, the closed PDMS decal was transferred onto the silicon substrate and $O_2/CF_4$ RIE was performed to remove the top layer. The $O_2/CF_4$ gas mixture not only removed the PDMS, but also etched the silicon substrate, as shown in FIG. 5A. To prevent etching of the silicon by $O_2/CF_4$ RIE, additional layers may be formed over the silicon substrate.

Figure 6A:
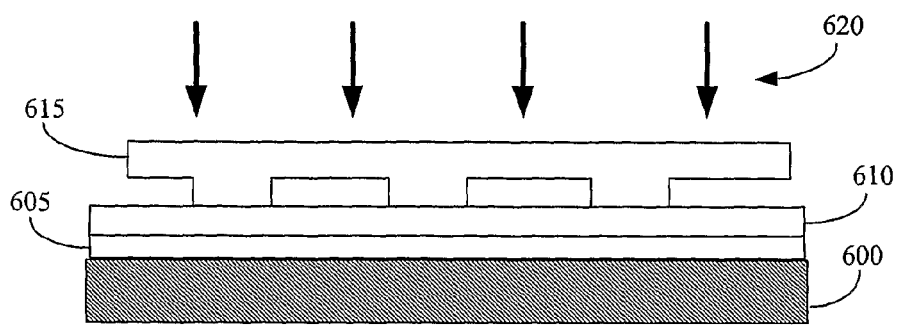
FIGS. 6A and 6B conceptually illustrate an exemplary process for depositing multiple layers over a silicon substrate, in accordance with the present invention.
Figure 6B:
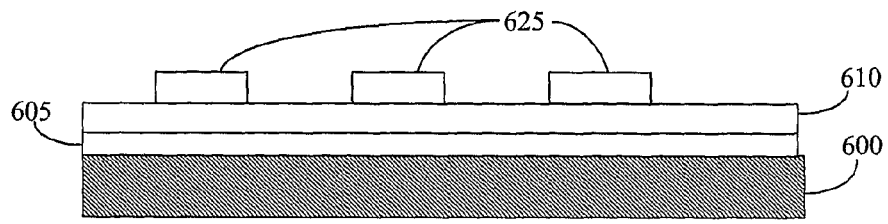

FIGS. 6A and 6B conceptually illustrate an exemplary process for depositing multiple layers over a silicon substrate 600. In the illustrated embodiment, a 200 nm thick layer 605 of aluminum (Al) was deposited onto the silicon substrate 600. The Al layer 605 acts as an etch mask. Next, a 10 nm thick layer of silicon oxide ($SiO_2$) film 610 is deposited on top of the Al layer 605. In some cases, the $SiO_2$ film 610 may promote the adhesive transfer of a PDMS decal 615. A reactive ion etching with $O_2/CF_4$, indicated by arrows 620, may be used to etch a portion of the PDMS decal 615, which may result in the patterned portions 625 remaining irreversibly attached to the substrate 600, as shown in FIG. 6B.

Figure 7:
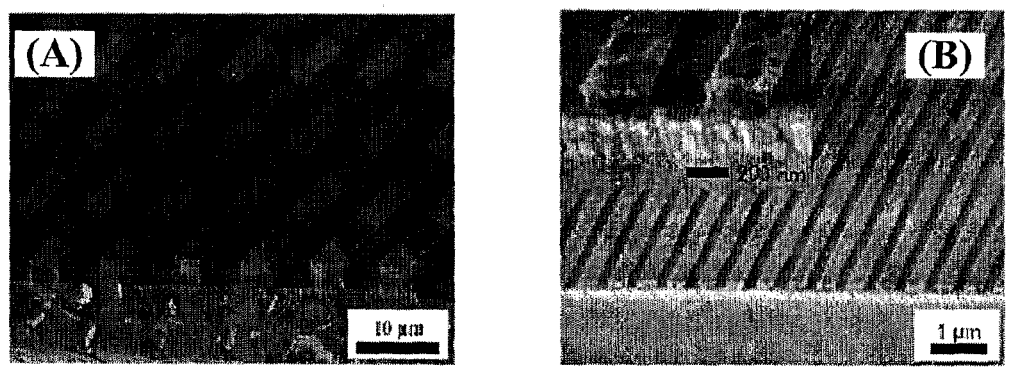
FIGS. 7A and 7B present SEM images of 5 μm and 300 nm wide PDMS lines patterned on the $SiO_2$/Al/Si substrate after removal of a top PDMS layer by RIE, in accordance with the present invention.

FIGS. 7A and 7B present SEM images of 5 μm and 300 nm wide PDMS lines patterned on the $SiO_2$/Al/Si substrate after removal of a top PDMS layer by RIE. The Al layer is almost intact and the silicon substrate is completely maintained after RIE. To verify that an Al layer is needed to protect the silicon substrate from the $O_2$/$CF_4$ RIE, a control experiment was performed in which only the $SiO_2$ layer was used to protect silicon substrate from the $O_2$/$CF_4$ RIE. Without the Al layer, the $SiO_2$ layer was breached, which lead to the silicon layer being damaged under the same conditions as used to produce the structure shown in FIGS. 7A and 7B.

Figure 8A:
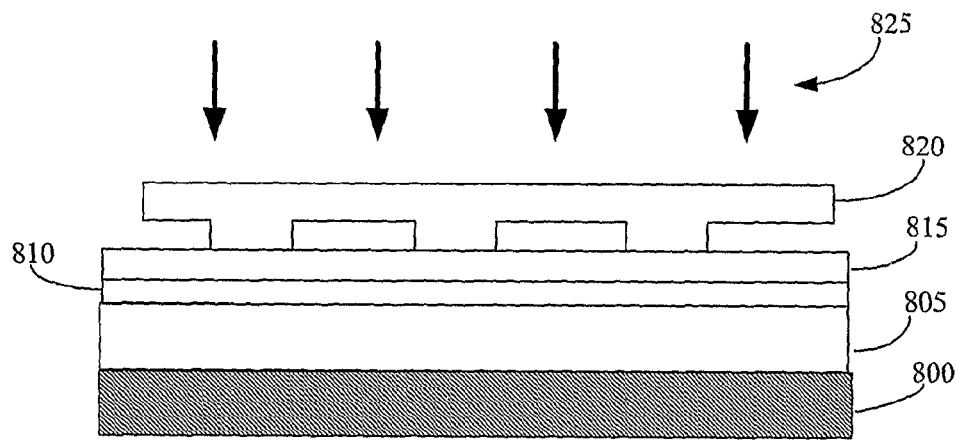
FIGS. 8A, 8B, and 8C conceptually illustrate an exemplary process of multilayer lithography, in accordance with the present invention.
Figure 8B:
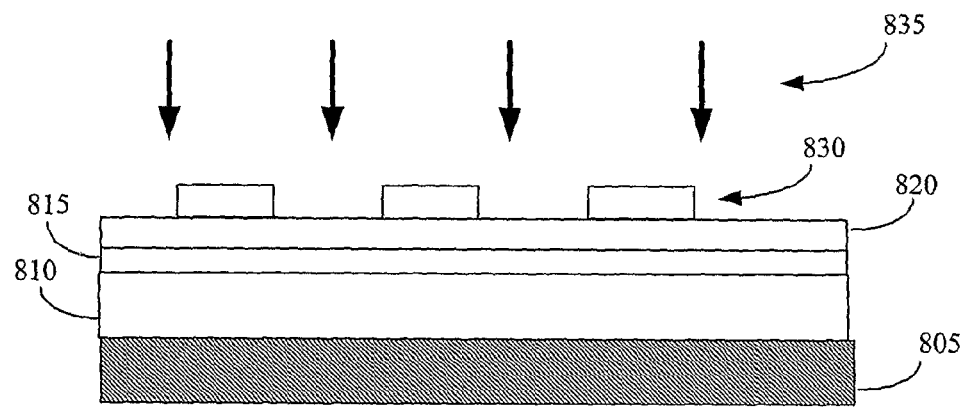
Figure 8C:
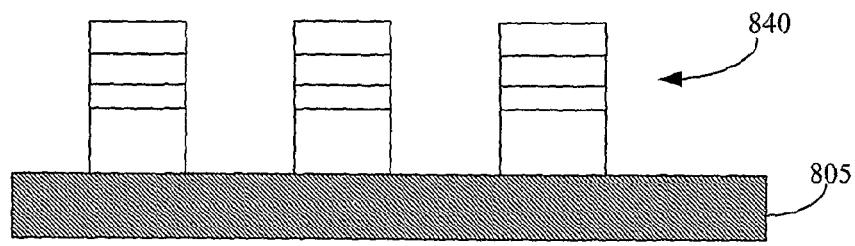

FIGS. 8A, 8B, and 8C conceptually illustrate an exemplary process of multilayer lithography. The decal transfer lithography and reactive ion etching procedures described above may be compatible with commercially available planarization layers (PLs) commonly used for microelectronic fabrication. Multilayer lithography (e.g., bilayer and trilayer lithography) was developed to achieve higher resolution by smoothing underlying substrate topography and higher aspect ratio after etching. For example, in bilayer lithography, a resist structure is coated directly on top of the PL. For another example, in trilayer lithography, a resist is coated on top of an additional etch mask layer, which is coated on the PL. In various embodiments, photoresists and/or spin-on-glass materials may be used for the PL. Photoresists have typically been more popular than spin-on-glass, because photoresists may result in a more planar film.

In the embodiment shown in FIG. 8A-C, a 400 nm thick planarization layer 805 (e.g. a layer formed from Microposit 1805) was spin-cast onto a silicon substrate 800 at a spin rate of about 5500 rpm for about 30 seconds. Additional layers may also be formed, as discussed above. In the illustrated embodiment, a 25 nm Al layer 810 and a 5 nm $SiO_2$ layer 815 were evaporated onto the planarization layer 805 by electron beam evaporation. In one embodiment, a Temescal FC-1800 Electron Beam Evaporator may be used to deposit Al and $SiO_2$ onto the targeted substrates. A polydimethylsiloxane decal 820 is irreversibly attached to the $SiO_2$ layer 815 and a reactive ion etching process, indicated by the arrows 825, is used to etch away a portion of the polydimethylsiloxane decal 820, leaving behind polydimethylsiloxane lines 830.

In one embodiment, the polydimethylsiloxane lines 830 may be used as an etch mask so that portions of the planarization layer 805, the silicon dioxide layer 815, and/or the aluminum layer 810 may be removed by one or more etching processes, as indicated by the arrows 835. In the illustrated embodiment, exposed portions of portions of the planarization layer 805, the silicon dioxide layer 815, and the aluminum layer 810 were removed by wet etching and anisotropic $O_2$ RIE, resulting in high aspect ratio resist features 840 on the silicon substrate 800, as shown in FIG. 8C. In the illustrated embodiment, anisotropic etching of the planarization layer 800 was carried out using 20 mTorr of total gas pressure, 10 sccm $O_2$ of gas flow rates, and 100 W of RF power.

Figure 9:
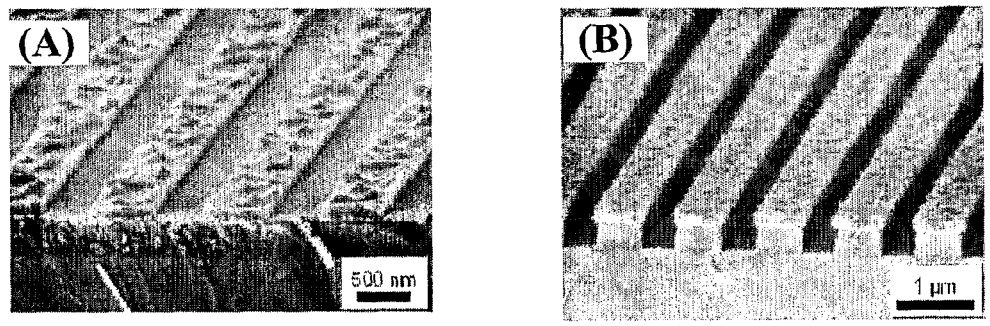
FIG. 9A shows a cross-sectional SEM image of 500 nm PDMS lines transferred onto a $SiO_2$/Al/PL/Si substrate, in accordance with the present invention.
FIG. 9B shows high aspect ratio resist features formed by etching exposed portions of portions of a planarization layer, a silicon dioxide layer, and an aluminum layer, in accordance with the present invention.

FIG. 9A shows a cross-sectional SEM image of 500 nm PDMS lines transferred onto a $SiO_2$/Al/PL/Si substrate after removing the top layer of a closed PDMS decal, such as the polydimethylsiloxane decal 820 shown in FIG. 8A, by RIE. As shown in FIG. 9A, the 25 nm thick Al layer is still intact and successfully served as an etch mask for the $O_2$/$CF_4$ RIE. FIG. 9B shows high aspect ratio resist features formed by etching exposed portions of portions of a silicon dioxide layer, an aluminum layer, and a planarization layer, as discussed above.

To illustrate the applicability of this method to the fabrication of electronic devices, a silicon-based thin-film transistor was fabricated from a silicon-on-insulator (SOI) wafer using decal transfer lithography and RIE. A source-drain-patterned closed-type decal was transferred onto the $SiO_2$/Al/Si substrate using the procedure described above. The top layer of the closed-type PDMS decal was removed by RIE using 300 mTorr of total gas pressure, 5 sccm $O_2$ and 35 sccm $CF_4$ of gas flow rates, and 200 W of RF power. After removing the top layer, the sample was immersed in a 49% HF aqueous solution for 5 sec to remove the $SiO_2$ not protected by the decal. After etching, the planarization layer may be rinsed using a mixture of phosphoric acid, acetic acid, nitric acid, and water. In this example, the sample was rinsed with deionized water and immersed in an aluminum etchant (AL-II) for 30 sec to remove the exposed Al. The sample was then rinsed with deionized water and immersed in 1 M TBAF solution in THF for 2 min to remove the PDMS decal. In the last step, the 49% HF aqueous solution was used to remove the $SiO_2$ layer on Al.

Figure 10:
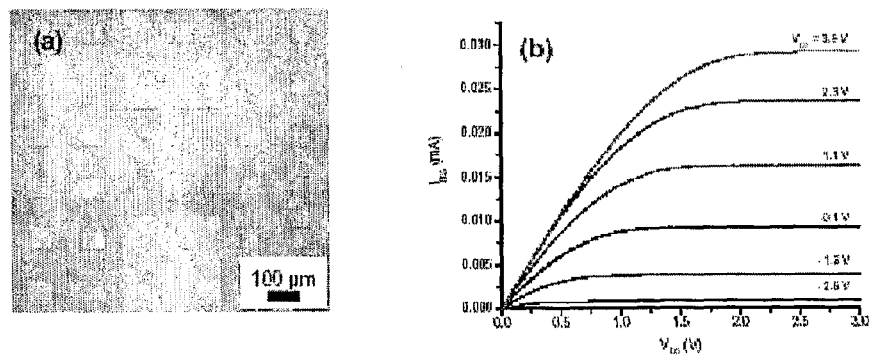
FIG. 10A shows an optical micrograph of one transistor in a large area array, in accordance with the present invention.
FIG. 10B displays current-voltage (I-V) characteristics of a transistor device fabricated in accordance with the present invention.

FIG. 10A shows an optical micrograph of one transistor in a large area array. Optical micrographs were recorded using an Olympus BH-2 optical microscope interfaced with a Panasonic GP-KR222 digital color camera. FIG. 10B displays current-voltage (I-V) characteristics of a transistor device fabricated by this methodology. In the illustrated embodiment, the vertical axis represents current in milli-Amperes and the horizontal axis indicates voltage in volts. These I-V curves demonstrate the utility of this process for the fabrication of functional electronic devices across large areas. The successful application of this methodology for the fabrication of electronic devices across large areas demonstrates its potential to extend the utility of soft lithography.

Figure 11:
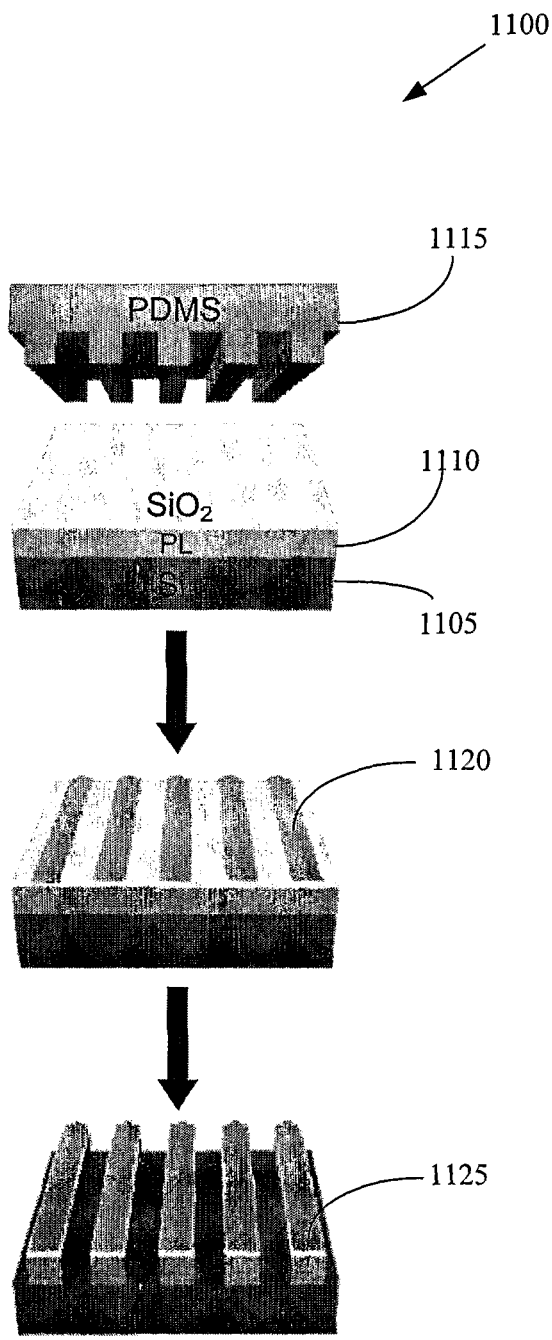
FIG. 11 conceptually illustrates one exemplary embodiment of a method for forming high-aspect-ratio resist structures on a substrate, in accordance with the present invention.

FIG. 11 conceptually illustrates one exemplary embodiment of a method 1100 for forming high-aspect-ratio resist structures on a substrate 1105. In the illustrated embodiment, the substrate 1105 is silicon, although any substrate may be used in alternative embodiments. A planarization layer 1110 has been formed above the substrate 1105. In the illustrated embodiment, the planarization layer 1110 is formed by a conventional organic polymer used in the art for such purposes, e.g. Shipley 1805, but other materials can be used as well. This layer is in turn capped with a thin adhesion layer of $SiO_2$ deposited by an evaporative method. However, persons of ordinary skill in the art should appreciate that, in alternative embodiments, the planarization layer 1110 may be formed of any desirable material and/or may include a plurality of layers. A patterned silicon-containing elastomer 1115 is then bonded to the $SiO_2$ layer 1115. A detailed description of techniques for forming the patterned silicon-containing elastomer 1120 and bonding the patterned silicon-containing elastomer 1120 to the $SiO_2$ layer 1115 are presented above.

Briefly, in the illustrated embodiment, a PDMS prepolymer (Dow Corning) was cast onto a master with a relief pattern (i.e., a photoresist patterned silicon wafer) and cured at 65° C. The cured PDMS stamp was extracted from the master, and the patterned PDMS surface was exposed to UV/Ozone (UVO) for 150 sec, and immediately placed in conformal contact with an $SiO_2$/Planarization layer(PL)/Si (100) substrate and cured at 65° C. A low pressure mercury lamp (BHK), (173 μW/cm$^2$) was used for UV/Ozone (UVO) treatment of PDMS which helps to induce a strong adhesion between the PDMS and the $SiO_2$ layer 1115.

A portion of the silicon-containing elastomer 1115 is then removed by cohesive mechanical failure (CMF). Cohesive mechanical failure (CMF) patterning is a known type of soft lithography based on the transfer of PDMS patterns to a substrate via the interfacial adhesion and mechanical failure of PDMS. After the portion of the silicon-containing elastomer 1115 has been removed, a patterned portion 1120 of the silicon-containing elastomer 1115 remains bonded to the planarization layer 1110. In the illustrated embodiment, the PDMS patterns were transferred by mechanically peeling off the bulk PDMS. An etching process, such as reactive ion etching (RIE), is then used to form one or more structures 1125 by etching a portion of the planarization layer 1110 using the patterned portion 1120 as a mask. This combination of CMF and RIE techniques may enable patterning of submicron-sized and/or nano-sized, high aspect ratio resist structures 1125 on the substrate 1105.

Figure 12:
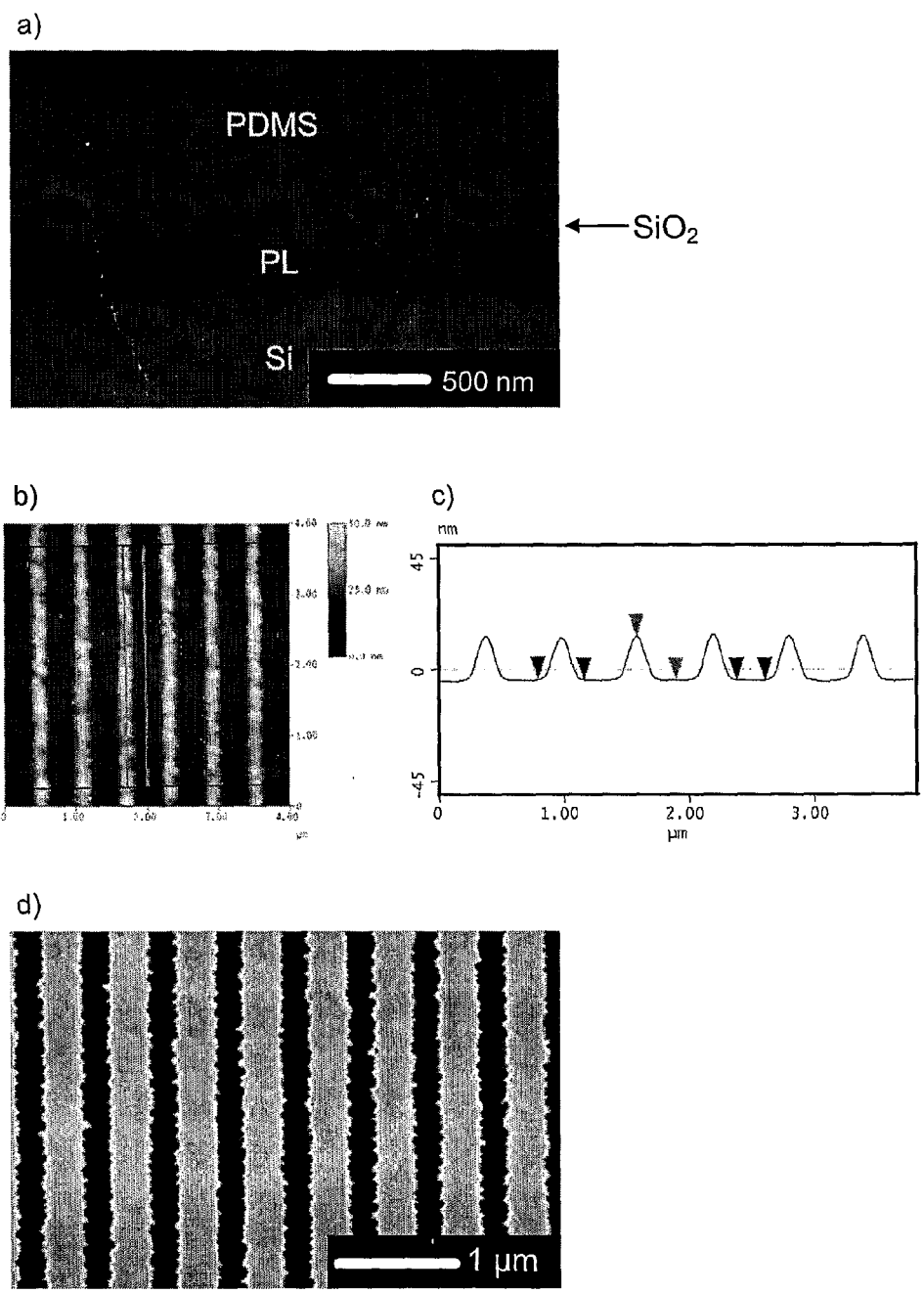
FIGS. 12A-D show images of PDMS lines formed on a substrate, in accordance with the present invention.
Figure 13:
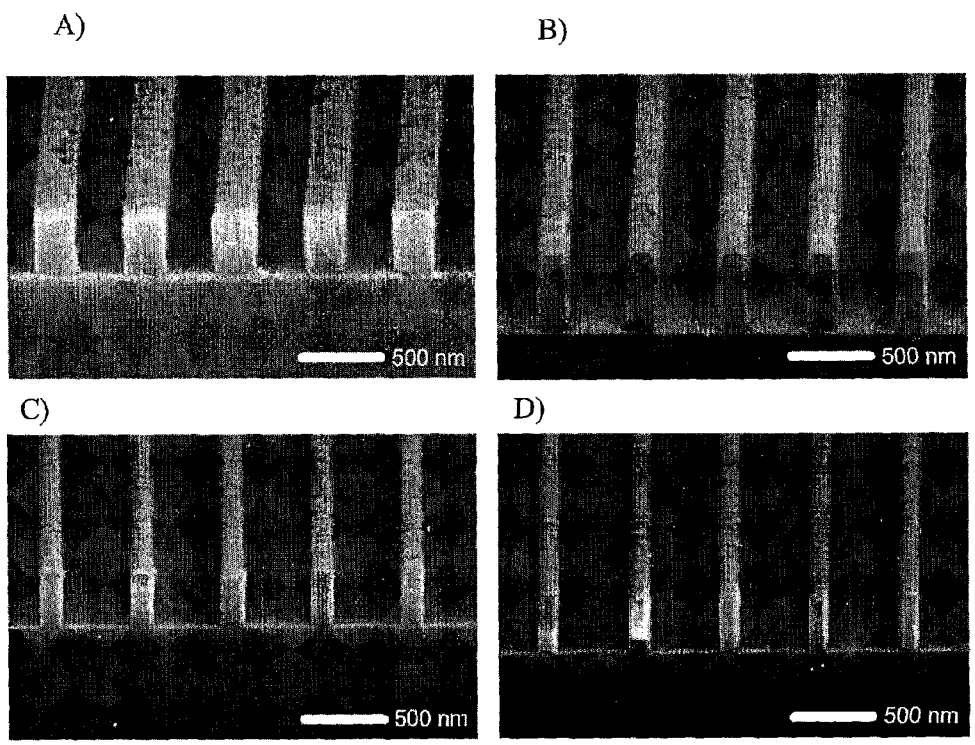
FIGS. 13A, 13B, 13C, and 13D show cross-sectional scanning electron microscope (SEM) images of PDMS/$SiO_2$/PL resist structures on Si(100) substrates, in accordance with the present invention.

FIG. 12A shows a cross-sectional SEM image of an interface between a PDMS replica and a substrate before peeling off the PDMS. FIGS. 12B and 12C show, respectively, an AFM image and a cross-section of the PDMS lines after peeling off the PDMS replica. The AFM cross-section shown in FIG. 12B reveals that the surface of the transferred PDMS lines is tapered and the average height at the center is about 18 nm. The width of PDMS lines and gap between the lines are 370 nm and 230 nm, respectively. FIG. 12D shows the top view SEM image of the same sample after dry etching of the $SiO_2$ for 33 sec and anisotropic etching of the PL. The $SiO_2$ film was removed in a condition with 50 mTorr of total gas pressure, 40 sccm of $CF_4$ flow rate, and 30 W of RF power, and anisotropic etching of the PL was carried out using 20 mTorr of total gas pressure, 10 sccm of $O_2$ flow rate, and 100 W of RF power for 5 min. The average width and gap of the lines are 360 nm and 240 nm, respectively. Comparing these patterned lines before (FIG. 12B) and after (FIG. 12D) dry etching, the width of the line slightly decreased after etching. This result may be because the $CF_4$ plasma used for dry etching of $SiO_2$ removes not only the $SiO_2$ layer but also the PDMS resulting in the slightly narrower PDMS lines.

FIGS. 13A, 13B, 13C, and 13D show cross-sectional scanning electron microscope (SEM) images of $PDMS/SiO_2/PL$ resist structures on Si(100) substrates resulting from $SiO_2$ etching for various times and anisotropic etching of PL for 5 min. As shown in the figures, the width of the patterned lines decreases as the period for dry etching of $SiO_2$ increases. The average widths of the lines in FIGS. 13A, 13B, 13C, and 13D are 250, 180, 130, and 100 nm, respectively. These figures demonstrate that the $PDMS/SiO_2$ layers can successfully serve as an etch mask for anisotropic $O_2$ RIE of a PL and the width of the lines can be controlled down to 100 nm.

Figure 14:
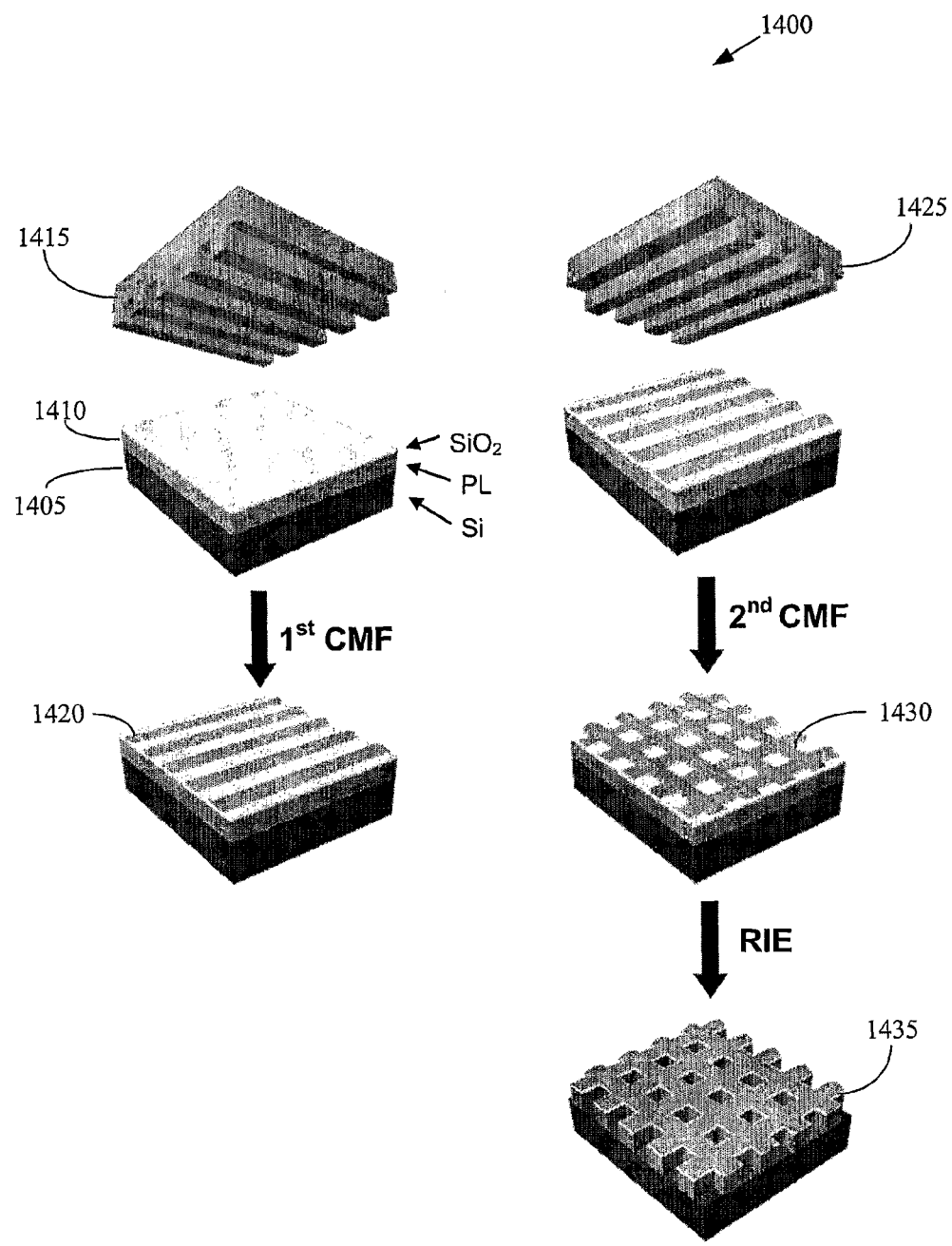
FIG. 14 conceptually illustrates one exemplary embodiment of a method for forming high-aspect-ratio resist structures on a substrate, in accordance with the present invention.

FIG. 14 conceptually illustrates one exemplary embodiment of a method 1400 for forming high aspect ratio resist structures on a substrate 1405. In the illustrated embodiment, the substrate 1405 is silicon, although any substrate may be used in alternative embodiments. A planarization layer 1410 has been formed above the substrate 1405. In the illustrated embodiment, the planarization layer 1410 is formed by a conventional organic polymer used in the art for such purposes, such as Shiply 1805 or other materials. However, persons of ordinary skill in the art should appreciate that, in alternative embodiments, the planarization layer 1410 may be formed of any desirable material and/or may include a plurality of layers. This planarization layer is in turn capped with a thin adhesion layer of $SiO_2$ deposited by an evaporative method. A first patterned silicon-containing elastomer 1420 is then bonded to the adhesion layer 1415, as discussed in detail above. A portion of the first silicon-containing elastomer 1420 may be removed and a first patterned portion 1425 of the first silicon-containing elastomer 1420 may remain bonded to the adhesion layer 1415.

In the illustrated embodiment, a second patterned silicon-containing elastomer 1430 is then bonded to the first patterned portion 1425 using techniques such as discussed in detail above. A portion of the second silicon-containing elastomer 1430 may be removed and a second patterned portion 1435 of the second silicon-containing elastomer 1430 may remain bonded to the first patterned portion 1425. In the illustrated embodiment, the pattern associated with the first patterned portion 1425 is aligned substantially perpendicular to the pattern associated with the second patterned portion 1435. Accordingly, the combination of the first and second patterned portions 1425, 1435 forms a checkerboard pattern. However, persons of ordinary skill in the art should appreciate that the present invention is not limited to the checkerboard pattern. In alternative embodiments, the first and/or second patterned portions 1425, 1435 may have any desirable pattern and may be positioned in any desirable orientation. Furthermore, additional pattern portions may also be formed and bonded to the structure shown in FIG. 14.

The combination of the first and second patterned portions 1425, 1435 may be used as an etch mask. Thus, an etching process, such as reactive ion etching, may be used to etch the planarization layer 1410 through the first and second patterned portions 1425, 1435 to form a structure 1435 in the planarization layer 1410. In one embodiment, the structure 1440 formed using the etching process may include submicron and/or nanometer scale structures. Conventional imprinting techniques, which are performed at high temperature (e.g., above the glass transition temperature of polymer), can not be used to imprint multiple patterns on the substrate because the previously imprinted patterns would be destroyed by heating.

Figure 15:
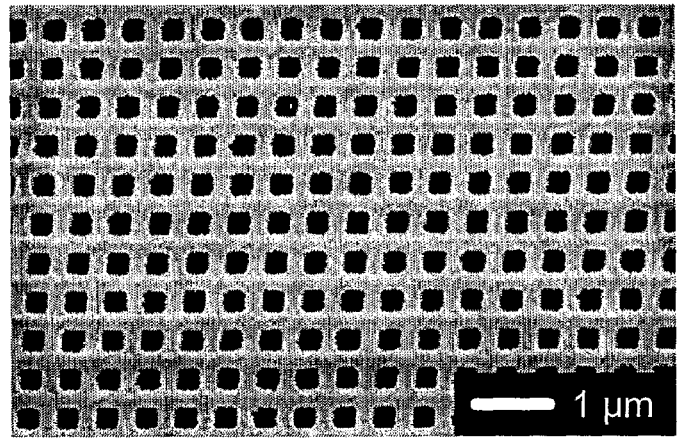
FIGS. 15A and 15B show SEM images of multiply transferred PDMS lines after dry etching of $SiO_2$ and PL layers, in accordance with the present invention.
Figure 15:
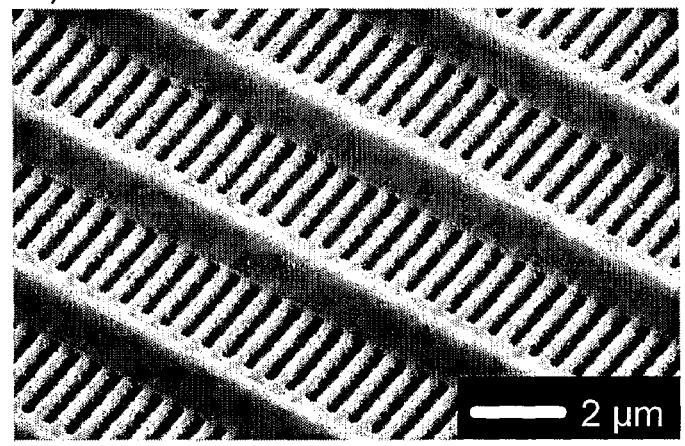

FIGS. 15A and 15B show SEM images of multiply transferred PDMS lines after dry etching of $SiO_2$ and PL layers. In the illustrated embodiment, a first set of 300 nm wide PDMS lines were patterned on a $SiO_2/PL/Si(100)$ substrate as described above and then exposed to UVO for 10 min. A second line-patterned PDMS replica was extracted from the master and exposed to UVO for 150 sec. The features in the second line-patterned PDMS replica have a characteristic width of 300 nm (FIG. 15A) or 2 μm (FIG. 15B). The UVO treated PDMS was optically aligned perpendicular to the PDMS line patterned substrate, placed in contact and cured at 65° C. for 5 hrs. After inducing adhesion, the PDMS slab was physically peeled away to deposit the second set of PDMS lines on top of the first set of PDMS lines. Finally, RIE has been performed to transfer the patterns to underlying $SiO_2$ and PL layers.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first pattern in a first surface of a first silicon-containing elastomer;
    bonding at least a portion of the first pattern to a substrate; and
    etching a second surface of the first silicon-containing elastomer, opposite to the first surface, to expose the first pattern;

wherein the portion of the first pattern bonded to the substrate remains attached to the substrate after the etching is completed.

2. The method of claim 1, wherein etching the second surface of the first silicon-containing elastomer comprises etching, after etching the second surface of the first silicon-containing elastomer to expose the first pattern, a portion of the substrate using the first pattern as a mask.

3. The method of claim 1, wherein bonding the portion of the pattern to the substrate further comprises bonding the portion of the first pattern to the substrate such that the bonded portion of the first pattern and the substrate are irreversibly attached.

4. The method of claim 1, wherein bonding the portion of the first pattern to the substrate further comprises exposing the first pattern to UV/Oxide.

5. The method of claim 1, wherein forming the first pattern in a surface of the first silicon-containing elastomer further comprises forming the first pattern in a surface of the first silicon-containing elastomer comprising polydimethylsiloxane.

6. The method of claim 1, wherein etching the second surface of the first silicon-containing elastomer further comprises etching the second surface of the first silicon-containing elastomer using reactive ion etching.

7. The method of claim 6, wherein etching the second surface of the first silicon-containing elastomer using reactive ion etching further comprises etching the second surface of the first silicon-containing elastomer using a fluorine and oxygen-based plasma.

8. The method of claim 1, wherein bonding the portion of the first pattern to the substrate further comprises placing the portion of the first pattern in contact with the substrate.

9. The method of claim 8, wherein bonding the portion of the first pattern to the substrate further comprises curing the portion of the first pattern while in contact with the substrate for a selected period of time at a selected temperature.

10. The method of claim 1, further comprising:
depositing a metal layer above the substrate and below the first pattern; and
depositing an adhesion layer above the metal layer and below the first pattern.

11. The method of claim 10, wherein depositing the metal layer further comprises depositing an aluminum layer and depositing the adhesion layer further comprises depositing a silicon dioxide layer.

12. The method of claim 1, wherein the substrate comprises a silicon substrate and at least one layer, and bonding at least a portion of the first pattern to the substrate comprises:
depositing at least one layer over the silicon substrate; and
bonding at least a portion of the first pattern to said at least one layer.

13. The method of claim 12, wherein depositing said at least one layer comprises:
depositing an aluminum layer over the silicon substrate; and
depositing a silicon dioxide layer over the aluminum layer.

14. The method of claim 13, wherein bonding the portion of the first pattern to said at least one layer comprises bonding the portion of the first pattern to the silicon dioxide layer.

15. The method of claim 1, further comprising rinsing the etched first silicon-containing elastomer.

16. The method of claim 15, wherein rinsing the etched silicon-containing elastomer further comprises rinsing the first etched silicon-containing elastomer using at least one of acetone, isopropyl alcohol, and deionized water.

17. The method of claim 15, further comprising drying the first etched silicon-containing elastomer with nitrogen gas.

18. The method of claim 1, further comprising forming a planarization layer above the substrate and below the first pattern.

19. The method of claim 18, further comprising etching a portion of the planarization layer through the etched first silicon-containing elastomer.

20. The method of claim 19, further comprising etching a portion of the substrate through the etched planarization layer.

21. The method of claim 1, wherein forming the first pattern comprises:
depositing a first elastomer precursor above a master pattern;
allowing the first elastomer precursor to substantially solidify into the first silicon-containing elastomer; and
removing the first silicon-containing elastomer from the master pattern.

22. The method of claim 21, wherein forming the first pattern further comprises spin-casting the first elastomer precursor onto a master pattern and curing the first elastomer precursor at approximately 70° C.

23. The method of claim 22, wherein forming the first pattern further comprises:
performing a no-stick treatment on the second surface of the first silicon-containing elastomer that is opposite the master pattern;
depositing a second elastomer precursor above the second surface of the first silicon containing elastomer that is opposite the master pattern; and
curing the second elastomer precursor into a supporting silicon-containing elastomer layer.

24. The method of claim 23, further comprising removing the supporting silicon-containing elastomer layer after the portion of the first pattern has been bonded to the substrate.

25. The method according to claim 1, further comprising:
etching a portion of the substrate through the exposed first pattern using the exposed first pattern as a mask.

26. The method of claim 25, wherein forming the first pattern comprises:
depositing a first elastomer precursor above a master pattern;
allowing the first elastomer precursor to substantially solidify into the first silicon-containing elastomer; and
removing the first silicon-containing elastomer from the master pattern.

27. The method of claim 25, wherein bonding the portion of the first pattern to the substrate further comprises bonding the portion of the first pattern to the substrate such that the bonded portion of the first pattern and the substrate are irreversibly attached.

28. The method of claim 25, wherein bonding at least a portion of the pattern to the substrate further comprises exposing the pattern to UV/Oxide.

29. The method of claim 25, further comprising removing a portion of the first silicon-containing elastomer using cohesive mechanical failure.

30. The method of claim 25, further comprising:
forming a second pattern in a surface of a second silicon-containing elastomer; and
bonding at least a portion of the second pattern to at least a portion of the first pattern.

31. The method of claim 30, wherein etching the portion of the substrate comprises etching a portion of the substrate through portions of the first and second silicon-containing elastomers corresponding to the first and second patterns.

32. The method of claim 25, further comprising forming a planarization layer above the substrate and below the first pattern.

33. The method of claim 32, further comprising depositing an adhesion layer above the planarization layer and below the first pattern.

34. The method of claim 33, wherein depositing the adhesion layer further comprises depositing a silicon dioxide layer.

35. The method of claim 33, further comprising etching a portion of the adhesion layer through the exposed first pattern.

36. The method of claim 35, wherein etching the portion of the adhesion layer further comprises etching the portion of the adhesion layer using reactive ion etching.

37. The method of claim 35, further comprising etching a portion of the planarization layer through a portion of the etched adhesion layer.

38. The method of claim 37, wherein etching the portion of the planarization layer further comprises etching the portion of the planarization layer using reactive ion etching.

39. The method of claim 37, further comprising rinsing the etched planarization layer.

40. The method of claim 39, where in rinsing the etched planarization layer further comprises rinsing the etched planarization layer using a mixture of phosphoric acid, acetic acid, nitric acid, and water.

41. The method of claim 39, where in rinsing the etched planarization layer further comprises rinsing the etched planarization layer using water.

* * * * *